(12) United States Patent
Jung et al.

(10) Patent No.: US 10,165,169 B2
(45) Date of Patent: Dec. 25, 2018

(54) IMAGE PROCESSING PACKAGE AND CAMERA MODULE HAVING SAME

(71) Applicant: SK Hynix Inc., Gyeonggi-do (KR)

(72) Inventors: Huy Chan Jung, Gyeonggi-do (KR);
Heui-Gyun Ahn, Gyeonggi-do (KR);
Sang Wook Ahn, Gyeonggi-do (KR);
Yong Woon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 103 days.

(21) Appl. No.: 15/101,286

(22) PCT Filed: Nov. 27, 2014

(86) PCT No.: PCT/KR2014/011479
§ 371 (c)(1),
(2) Date: Jun. 2, 2016

(87) PCT Pub. No.: WO2015/083979
PCT Pub. Date: Jun. 11, 2015

(65) Prior Publication Data
US 2016/0373629 A1 Dec. 22, 2016

(30) Foreign Application Priority Data
Dec. 2, 2013 (KR) ........................ 10-2013-0148505

(51) Int. Cl.
*H04N 5/225* (2006.01)
*H01L 27/146* (2006.01)

(52) U.S. Cl.
CPC ..... *H04N 5/2257* (2013.01); *H01L 27/14618* (2013.01); *H01L 27/14636* (2013.01); *H04N 5/2252* (2013.01); *H04N 5/2253* (2013.01); *H04N 5/2254* (2013.01); *H04N 5/2258* (2013.01); *H01L 2224/16145* (2013.01)

(58) Field of Classification Search
None
See application file for complete search history.

(56) References Cited

U.S. PATENT DOCUMENTS

| 9,973,668 | B2 * | 5/2018 | Lang | ...................... G03B 17/02 |
| 2004/0060032 | A1 * | 3/2004 | McCubbrey | ........ G06F 17/5054 |
| | | | | 716/104 |
| 2005/0099521 | A1 * | 5/2005 | Bleau | ................... H04N 5/2252 |
| | | | | 348/340 |
| 2010/0165188 | A1 * | 7/2010 | Jannard | ............... H04N 5/2252 |
| | | | | 348/375 |

(Continued)

FOREIGN PATENT DOCUMENTS

| KR | 1020100112852 | 10/2010 |
| KR | 101167159 | 7/2012 |

(Continued)

*Primary Examiner* — James Hannett
(74) *Attorney, Agent, or Firm* — IP & T Group LLP (57) ABSTRACT

The present invention provides an image processing package comprising: an image sensor for receiving an image of a subject, which is incident from the outside, in the form of light and converting the image of the subject into an image signal; and an image signal processor for processing the image signal which is output from the image sensor and reproducing the image of the subject, wherein the image processing package has a structure in which the image sensor is vertically stacked on the image signal processor.

12 Claims, 5 Drawing Sheets

(56) References Cited

U.S. PATENT DOCUMENTS

| | | | |
|---|---|---|---|
| 2013/0068929 A1* | 3/2013 | Solhusvik | H01L 27/14634 250/208.1 |
| 2015/0155323 A1* | 6/2015 | Ahn | H01L 27/14616 257/184 |

FOREIGN PATENT DOCUMENTS

| | | | |
|---|---|---|---|
| KR | 101240537 | 3/2013 | |
| KR | 1020130128688 | 11/2013 | |
| WO | WO 2012144869 A2 * | 10/2012 | H01L 27/14618 |

* cited by examiner

IMAGE PROCESSING PACKAGE AND CAMERA MODULE HAVING SAME

This application is a national stage application of PCT/KR2014/011479 filed on Nov. 27, 2014, which claims priority of Korean patent application number 10-2013-0148505 filed on Dec. 2, 2013. The disclosure of each of the foregoing applications is incorporated herein by reference in its entirety.

TECHNICAL FIELD

The present invention relates to a camera, more particularly, to an image processing package for processing an image signal and a camera module including the same.

BACKGROUND ART

A camera module is widely used in a mobile phone or a smart phone at present, but in case that the camera module is miniaturized as the development of an optical technology and a semiconductor technology, the camera module may be used in a small communication device such as a watch phone. Various devices, e.g., an image sensor, an image processing device, a data storage device and so on, for processing an image signal in a digital manner are included in the camera module.

In order to miniaturize the camera module, these devices must be miniaturized and a used power of these devices should be reduced. However, since these devices are mounted on a printed circuit board (PCB), to miniaturize these device is restricted and to reduce the power consumption is restricted. Thus, a new type structure is requested to be developed to miniaturize the camera module.

DISCLOSURE

Technical Problem

The present invention is directed to an image processing package having a structure for implementing a sub-miniaturization and a low power, and a camera module including the same.

Technical Solution

In accordance with an embodiment of the present invention, a semiconductor device an image processing package includes an image sensor suitable for receiving an image of a subject, which is incident from an outside, in a form of light and converting the image of the subject into an image signal; and an image signal processor suitable for processing the image signal which is outputted from the image sensor and reproducing the image of the subject, wherein the image sensor is vertically stacked on the image signal processor.

The image sensor and the image signal processor may be electrically coupled to each other by one of a through silicon via (TSV) manner and a direct bonding interface (DBI) manner.

The image processing package may further include a controller suitable for controlling an operation of the image signal processor, wherein the controller is disposed on a lower portion of the image signal processor.

The image processing package may further include a memory device suitable for storing a signal outputted from the controller, wherein the memory device is disposed on a lower portion of the controller.

The controller and the memory device are electrically coupled to each other by one of a through silicon via (TSV) manner and a direct bonding interface (DBI) manner.

In accordance with an embodiment of the present invention, a camera module includes a body; an optical series mounted on an upper portion of the body and having at least one lens; a color filter suitable disposed on a lower portion of the optical series and filtering and outputting a light, which passes through the optical series; and an image processing package disposed on a lower portion of the color filter, receiving the light outputted from the color filter and performing an image process.

Advantageous Effects

As described above, according to the present invention, an image processing package includes an image sensor, an image signal processor, a controller and a memory device, which are sequentially and vertically stacked from top to bottom. The image sensor, the image signal processor, the controller and the memory device are electrically coupled to each other using one of a through-silicon via (TSV) manner and a direct bond interface (DBI) manner.

Like this, in a state that the image sensor, the image signal processor, the controller and the memory device of the image processing package included in the camera module are stacked, by electrically coupling the image sensor, the image signal processor, the controller and the memory device to each other by the TSV manner or the DBI manner, the camera module is miniaturized, a sub-miniature manufacturing is performed, or a low power is consumed.

BEST MODE

Hereinafter, various embodiments will be described below in more detail with reference to the accompanying drawings such that a skilled person in this art understand and implement the present invention easily.

Figure 1:
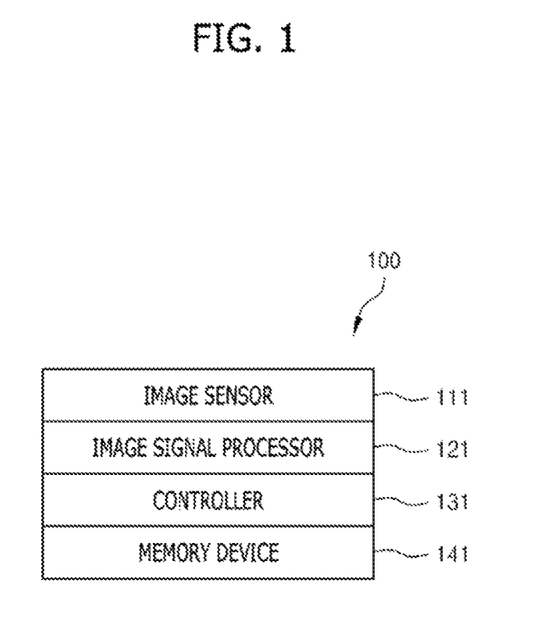
FIG. 1 is a block diagram illustrating an image processing package in accordance with the present invention.

FIG. 1 is a block diagram illustrating an image processing package in accordance with the present invention. Referring to FIG. 1, an image processing package 100 includes an image sensor 111, an image signal processor 121, a controller 131 and a memory device 141. It is preferable that the image processing package 100 has a structure where the image sensor 111, the image signal 121, the controller 131 and the memory device 141 are sequentially stacked from the top.

The image sensor 111 is mounted at a first layer from an upper portion of the image processing package 100. The image sensor 111 has a pixel array (not shown) on an entire upper surface thereof, and the pixel array receives a light, which is incident from the outside, and converts the light into an electrical signal. That is, the image sensor 111 converts an image of a subject, which is incident from the outside, in the form of light into an image signal, and outputs the converted image signal. The image signal is an analog signal or a digital signal. A complementary metal oxide semiconductor (CMOS) image sensor may be used as the image sensor 111, and a charge coupled device (CCD) and an infrared ray sensor may be used as the image sensor 111. Since the pixel array for receiving the light of the outside is included in the image sensor 111, it is difficult to reduce the size of the image sensor 111. Because the pixel array receives the light of the outside and has a larger size than a predetermined size.

The image signal processor (ISP) 121 is disposed under the image sensor 111. The image signal processor 121 receives and process the image signal outputted from the image sensor 111. For example, the image signal processor 121 interpolates a color of the image signal included in the image signal outputted from the image sensor 111 and performs a function for reproducing the image of the subject.

The controller 131 is disposed under the image signal processor 121. The controller 131 stores the data on the memory device 141, reads the data stored on the memory device 141, or controls a process of the image signal through a communication with the image signal processor 121. The controller 131 may include a static random access memory (SRAM) or a dynamic random access memory (DRAM). In case that the controller 131 includes the SRAM or the DRAM, the SRAM or the DRAM may be used as a cache memory for storing the data temporarily.

In case that the image signal processor 121 is coupled to the controller 131, the image signal processor 121 operates as a slave, and the controller 131 performs a master operation as an application processor. The controller 131 may drive the image signal processor 121 using a microprocessor such as an ARM chip or a MIPS chip. In case that the controller 131 includes an application processor, the application processor may include a cache memory in the inside.

The controller 131 performs an input/output operation of the data with an external device. That is, the controller 131 analyzes the data transferred from the external device, and controls an operation of the image signal processor 121 through this. The controller 131 interprets and performs whether the data is to be stored in the memory device 141 or the data stored in the memory device 141 is to be transferred to the external device.

The memory device 141 is disposed under the controller 131, i.e., at the lowest layer of the image processing package 100. The memory device 141 may receive and store the data from the controller 131, or may store a firm ware for operating the controller 131 or an application program. The memory device 141 may include a non-volatile memory device, e.g., a flash memory, a ferroelectric random access memory (FeRAM), a phase change random access memory (PRAM), and so on.

As described above, since the image sensor 111, the image signal processor 121, the controller 131 and the memory device 141 included in the image processing package 100 are stacked from the top to the bottom as one package, the size of the image processing package 100 is greatly reduced. Also, since the distances between the image sensor 111 and the Image signal processor 121, between the Image signal processor 121 and the controller 131, and between the controller and the memory device 141 are very short, a power consumption of the image processing package 100 may be greatly reduced.

Figure 6:
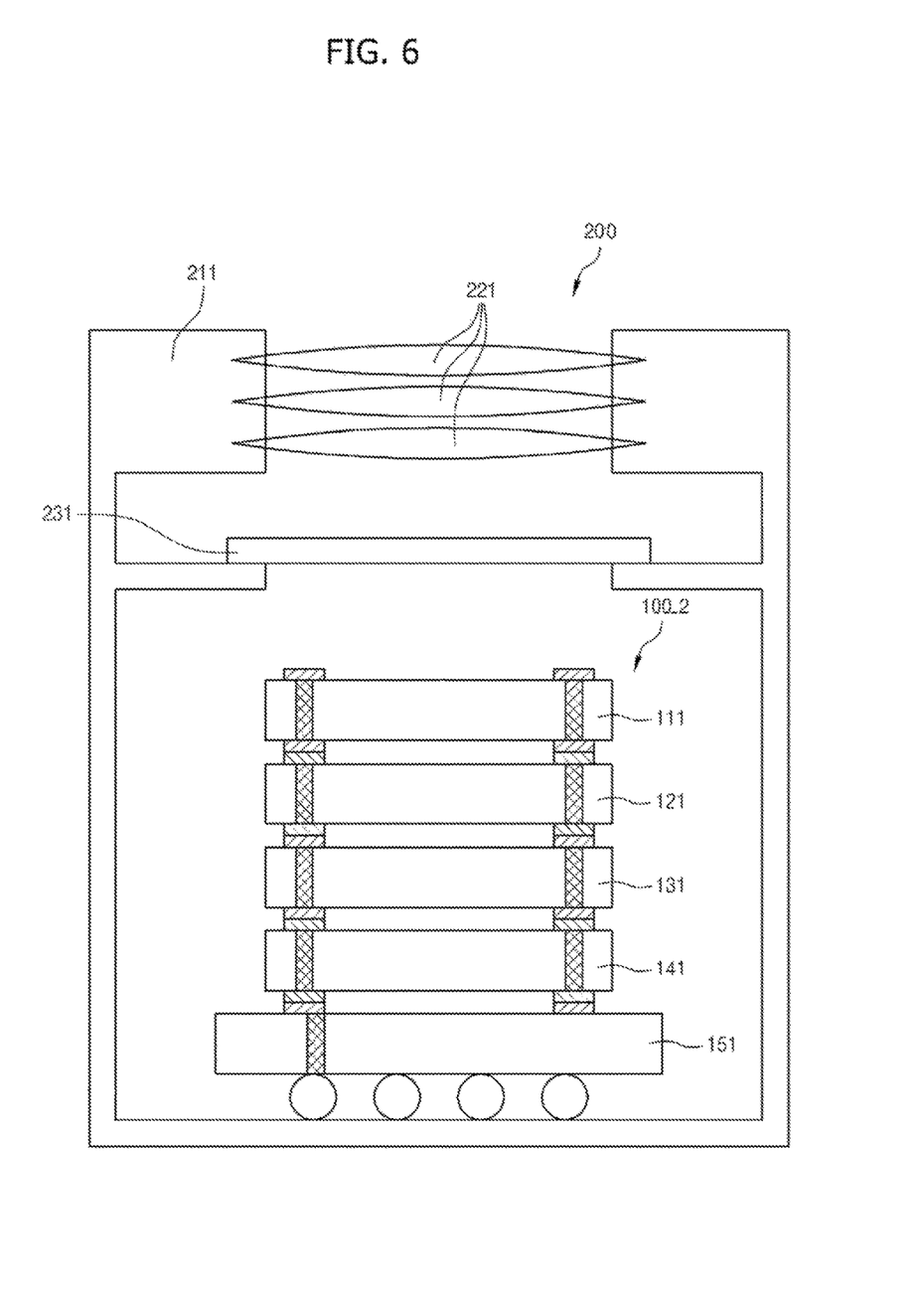
FIG. 6 is a cross sectional view of a camera module having the image processing package shown in FIG. 5b.

Since the image processing package 100 according to the present invention may be manufactured as a subminiature type, the image processing package 100 may be mounted on the camera module 200 of FIG. 6, and may be used in a device having a specific purpose such as a medical field or a glasses field. That is, since the size of the camera module 200 of FIG. 6 having the image processing package 100 is very small, the camera module 200 of FIG. 6 may be applied to various fields.

Figure 2:
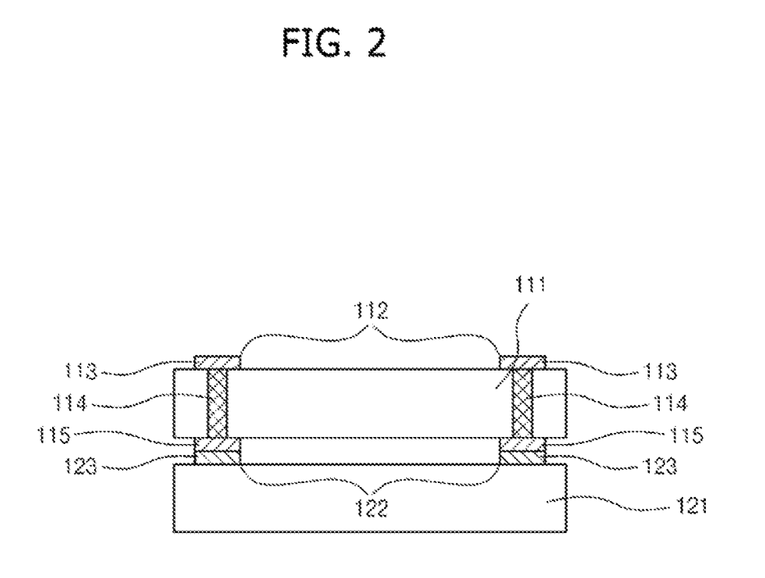
FIG. 2 is a block diagram illustrating a coupling structure of the image sensor and the image signal processor shown in FIG. 1.

FIG. 2 is a block diagram illustrating a coupling structure of the Image sensor 111 and the image signal processor 121 shown in FIG. 1. Referring to FIG. 2, the image signal processor 121 is disposed under the image sensor 111.

The image sensor 111 and the image signal processor 121 are coupled to each other using a TSV manner or a DBI manner.

That is, the pixel array is formed on the upper surface of the image sensor 111, and a plurality of first via lines 114 are formed to penetrate the image sensor 111 from the top to the bottom. And, the pixel array 112 and a plurality of first upper pads 113, which are coupled to the plurality of first via lines 114, are formed on the upper surface of the image sensor 111, and a plurality of first lower pads 115, which are coupled to the plurality of first via lines 114, are formed on a lower surface of the image sensor 111. Thus, a signal generated from the pixel array 112 formed on the upper surface of the image sensor 111 is transferred to the plurality of first lower pads 115 through the plurality of first upper pads 113 and the plurality of first via lines 114. The plurality of first via lines 114 may be formed by the TSV manner.

A circuit for processing the image signal and a plurality of second upper pads 123 coupled to the circuit are formed on an upper portion of the image signal processor 121. The plurality of first lower pads 115 and the plurality of second upper pads 123 are bonded to each other and are electrically coupled to each other. The plurality of first lower pads 115 and the plurality of second upper pads 123 may be bonded to each other using one of the TSV manner and the DBI manner.

Like this, the image sensor 111 is electrically coupled to the image signal processor 121 through the plurality of first via lines 114. Thus, the signal outputted from the image sensor 111 may be transferred to the image signal processor 121 through the plurality of first via lines 114.

Like this, since the image sensor 111 and the image signal processor 121 are coupled to each other through the plurality of first via lines 114, which are formed by the TSV manner, the image sensor 111 and the image signal processor 121 may have a little area and implement a lower power consumption.

Figure 3:
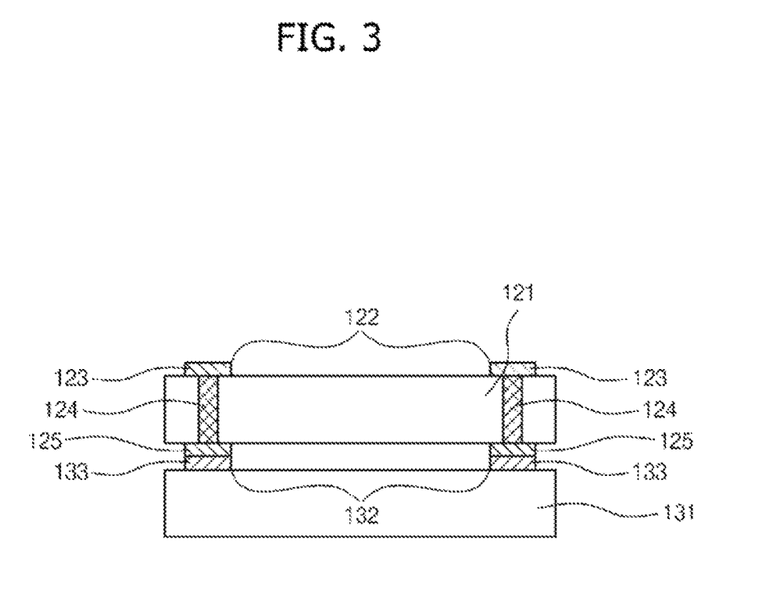
FIG. 3 is a block diagram illustrating a coupling structure of the image signal processor and the controller shown in FIG. 1.

FIG. 3 is a block diagram illustrating a coupling structure of the image signal processor 121 and the controller 131 shown in FIG. 1. Referring to FIG. 3, the controller 131 is disposed under the image signal processor 121.

The image signal processor 121 and the controller 131 are coupled to each other by the TSV manner or the DBI manner.

That is, a circuit 122 is formed on an upper portion of the image signal processor 121, a plurality of second upper pads 123 coupled to the circuit 122 and a plurality of second via lines 124, which penetrates the image signal processor 121 from the top to the bottom, are formed on the upper portion of the image signal processor 121. A plurality of second lower pads 125 coupled to the plurality of second via lines 124 are formed on a lower portion of the image signal processor 121. Thus, the signal generated from the circuit 122 formed on the upper portion of the image signal processor 121 is transferred to the plurality of second lower pads 125 through the plurality of second upper pads 123 and the plurality of second via lines 124. The plurality second via lines 124 is formed by the TSV manner.

A circuit for controlling a process of the image signal is formed on an upper portion of the controller 131, and a plurality of third upper pads 133 coupled to the circuit 132 are formed on the upper portion of the controller 131. The plurality of third upper pads 133 and the plurality of second lower pads 125 are bonded to each other and electrically coupled to each other. The plurality of second lower pads 125 and the plurality of third upper pads 133 may be bonded to each other using the TSV manner and the DBI manner.

Like this, the image signal processor 121 is electrically coupled to the controller 131 through the plurality of second via lines 124. Thus, the image signal processor 121 receives or transmits the signal from or to the controller 131 through the plurality of second via lines 124.

Like this, since the image signal processor 121 and the controller 131 are coupled to each other through the plurality of second via lines 124, which are formed by the TSV manner, the image signal processor 121 and the controller 131 may have a little area and implement a lower power consumption.

Figure 4:
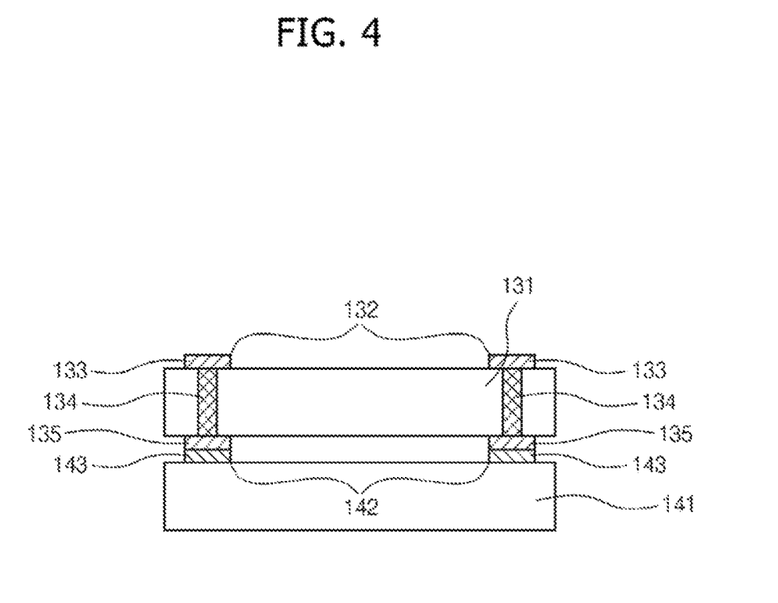
FIG. 4 is a block diagram illustrating a coupling structure of the controller and the memory device shown in FIG. 1.

FIG. 4 is a block diagram illustrating a coupling structure of the controller 131 and the memory device 141 shown in FIG. 1. Referring to FIG. 4, the memory device 141 is disposed under the controller 131.

The controller 131 and the memory device 141 are coupled to each other by the TSV manner or the DBI manner.

That is, a circuit 132 is formed on an upper portion of the controller 131, and the plurality of third upper pads 133 coupled to the circuit 132 and a plurality of third via lines 134, which penetrate the controller 131 from the top to the bottom, are formed on the upper portion of the controller. A plurality of third lower pads 135 coupled to the plurality of third via lines 134 are formed on a lower portion of the controller 131. Thus, the signal generated from the circuit 132 formed on the upper portion of the controller 131 is transferred to the plurality of third lower pads 135 through the plurality of third upper pads 133 and the plurality of third via lines 134. The plurality of third via lines 134 are formed by the TSV manner. The plurality of third lower pads 135 and a plurality of fourth upper pads 143 may be bonded to each other using one of the TSV manner and the DBI manner.

A memory circuit 142 for storing data is formed on an upper portion of the memory device 141, and the plurality of fourth upper pads 143 coupled to the memory circuit 142 are formed on the upper portion of the memory device. The plurality of fourth upper pads 143 and the plurality of third lower pads 135 are bonded to each other and electrically coupled to each other.

Like this, the controller 131 is electrically coupled to the memory device 141 through the plurality of third via lines 134. Thus, the controller 131 may receive or transmit the signal from or to the memory device 141 through the plurality of third via lines 134.

Like this, since the controller 131 and the memory device 141 are coupled to each other through the plurality of third via lines 134, which are formed by the TSV manner, the controller 131 and the memory device 141 may have a little area and implement a lower power consumption.

Figure 5A:
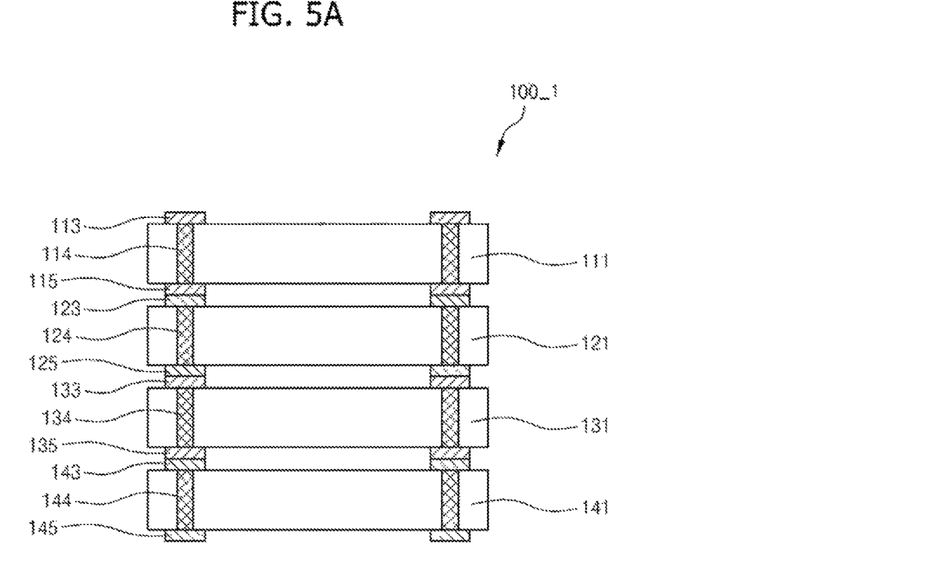
FIG. 5a is a cross sectional view of an image processing package in accordance with a first embodiment of the present invention.

FIG. 5a is a cross sectional view of an image processing package in accordance with a first embodiment of the present invention. Referring to FIG. 5a, an image processing package 100_1 includes a plurality of semiconductor chips 111 to 141, which are vertically stacked, e.g., an image sensor 111, an image signal processor 121, a controller 131 and a memory device 141, which are sequentially stacked from the top to the bottom. Four semiconductor chips 111 to 141, which are vertically stacked, are exemplarily described in FIG. 5a, but the number and a stacked direction of the plurality of semiconductor chips 111 to 141 are not restricted within this example. The number of the plurality of semiconductor chips 111 to 141 may be smaller or greater than four according to needs. The plurality of semiconductor chips 111 to 141 may be arranged in a combined structure of a vertical direction mounting and a horizontal direction mounting.

The plurality of semiconductor chips 111 to 141 include internal distribution lines (not shown), upper pads 113, 123, 133 and 143, and lower pads 115, 125, 135 and 145. The upper pads 113, 123, 133 and 143 and the lower pads 115, 125, 135 and 145 are electrically coupled to each other through the via lines 114, 124, 134, 144, which vertically penetrate the plurality of semiconductor chips 111 to 141.

The plurality of semiconductor chips 111 to 141 include a TSV structure or a DBI structure, respectively. Each of the plurality of semiconductor chips 111 to 141 may be electrically coupled to each other by a coupling member such as bumps formed on the upper pads 123, 133 and 143 and the lower pads 115, 125 and 135.

Like this, the image processing package 100_1 may have a small area, be manufactured in a subminiature size, and consume a lower power since the image sensor 111, the image signal processor 121, the controller 131 and the memory device 141, which are vertically stacked, are electrically coupled to each other by the TSV manner or the DBI manner.

Figure 5B:
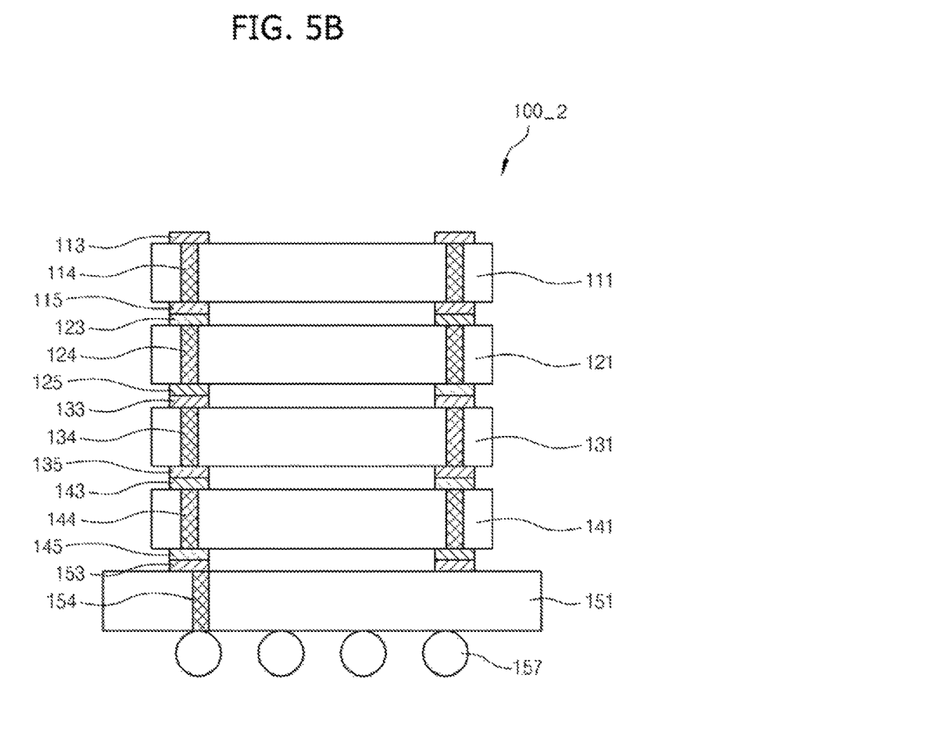
FIG. 5b is a cross sectional view of an image processing package in accordance with a second embodiment of the present invention.

FIG. 5b is a cross sectional view of an image processing package in accordance with a second embodiment of the present invention. Referring to FIG. 5b, an image processing package 100_2 includes a plurality of semiconductor chips 111 to 141, which are vertically stacked on a package substrate 151, e.g., an image sensor 111, an image signal processor 121, a controller 131 and a memory device 141, which are sequentially stacked from the top to the bottom. Four semiconductor chips 111 to 141, which are vertically stacked, are exemplarily described in FIG. 5b, but the number and a stacked direction of the plurality of semiconductor chips 111 to 141 are not restricted within this example. The number of the plurality of semiconductor chips 111 to 141 may be smaller or greater than four according to needs. The plurality of semiconductor chips 111 to 141 may be arranged in a combined structure of a vertical direction mounting and a horizontal direction mounting.

The plurality of semiconductor chips 111 to 141 include internal distribution lines (not shown), upper pads 113, 123, 133 and 143, and lower pads 115, 125, 135 and 145. The upper pads 113, 123, 133 and 143 and the lower pads 115, 125, 135 and 145 are electrically coupled to each other through the via lines 114, 124, 134, 144, which vertically penetrate the plurality of semiconductor chips 111 to 141.

The plurality of semiconductor chips 111 to 141 include a TSV structure or a DBI structure, respectively. Each of the plurality of semiconductor chips 111 to 141 may be electrically coupled to each other by a coupling member such as bumps formed on the upper pads 123, 133 and 143 and the lower pads 115, 125 and 135.

The package substrate 151 may be a flexible printed circuit board, a rigid printed circuit board and a combination thereof. The package substrate 151 includes substrate internal distribution lines (not shown), coupling pads 153 and coupling terminals 157. The coupling pads 153 are formed on an upper surface of the package substrate 151 and are coupled to one of the semiconductor chips, e.g., the lower pads 145 of the memory chip 141. The coupling terminals 157 are electrically coupled to the pads 153 through the internal distribution lines. The coupling terminals 157 may be formed on a side of the package substrate 151, i.e., a side where the semiconductor chips 111 to 141 are not stacked, e.g., a lower side of the package substrate 151. The coupling terminals 157 may include solder balls. The coupling terminals 157 are electrically coupled to the pads 153 through the internal distribution lines. In embodiments, the solder balls may be replaced by conductive bumps or lead grid array.

Figure 5C:
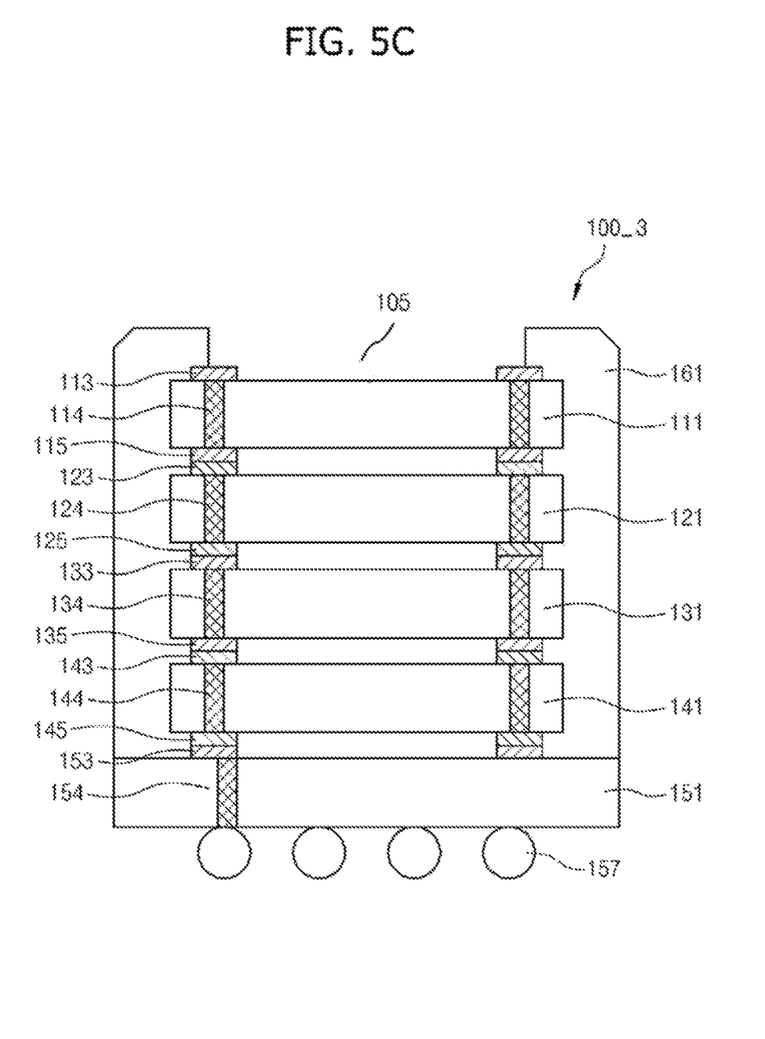
FIG. 5c is a cross sectional view of an image processing package in accordance with a third embodiment of the present invention.

Like this, the image processing package 100_2 may have a small area, be manufactured in a subminiature size, and consume a lower power since the image sensor 111, the image signal processor 121, the controller 131 and the memory device 141, which are vertically stacked, are electrically coupled to each other by the TSV manner or the DBI manner. FIG. 5c is a cross sectional view of an image processing package in accordance with a third embodiment of the present invention. Referring to FIG. 5c, an image processing package 100_3 includes a plurality of semiconductor chips 111 to 141, which are sequentially stacked on a package substrate 151, e.g., an image sensor 111, an image signal processor 121, a controller 131 and a memory device 141, which are sequentially stacked from the top to the bottom. A stack structure of the plurality of semiconductor chips 111 to 141 is encapsulated on the package substrate 151 by an encapsulant 161 such as a thermosetting resin. Herein, a part of the upper portion 105 of the image processing package 100_3 is not encapsulated by the encapsulant 161 and is opened. A light is incident on the image sensor 111 formed on the upper portion of the image processing package 100_3 from the outside through the opened part 105. Four semiconductor chips 111 to 141, which are vertically stacked, are exemplarily described in FIG. 5c, but the number and a stacked direction of the plurality of semiconductor chips 111 to 141 are not restricted within this example. The number of the plurality of semiconductor chips 111 to 141 may be smaller or greater than four according to needs. The plurality of semiconductor chips 111 to 141 may be arranged in a combined structure of a vertical direction mounting and a horizontal direction mounting.

Because the structure of the package substrate 151 is same as that shown in FIG. 5b, the detailed descriptions will be omitted.

The plurality of semiconductor chips 111 to 141 include a TSV structure or a DBI structure, respectively. Each of the plurality of semiconductor chips 111 to 141 may be electrically coupled to the coupling pads 153 of the package substrate 151 by a coupling member such as bumps.

As described above, the image processing package 100_3 include the image sensor 111, the image signal processor 121, the controller 131 and the memory device 141, which are sequentially stacked from the top to the bottom. Herein, the image sensor 111, the image signal processor 121, the controller 131 and the memory device 141 are electrically coupled to each other using one of the TSV manner and the DBI manner.

Like this, the image processing package 100_3 may have a small area, be manufactured in a subminiature size, and consume a lower power since the image sensor 111, the image signal processor 121, the controller 131 and the memory device 141, which are vertically stacked, are electrically coupled to each other by the TSV manner or the DBI manner.

FIG. 6 is a cross sectional view of a camera module having the image processing package shown in FIG. 5b. Referring to FIG. 6, a camera module 200, e.g., an optical module, a body 211, an optical series 221, a color filter 231 and an image processing package 100_2. The optical series 221 are mounted on an upper portion of the body 211 and have at least one lens, and the color filter 231 is mounted on a lower portion of the optical series 221. The image processing package 100_2 is mounted on a lower portion of the color filter 231.

The light, which is incident from the outside, is arrived at the image processing package 100_2 through the optical series 221 and the color filter 231. That is, the light passing through the color filter 231 is incident on the image sensor 111 included in the upper portion of the image processing package 100_2. Herein, the color filter 231 cuts off an infrared ray included in the light and passes only a visible ray. Thus, the image sensor 111 may correctly detect the image, which is incident through the optical series 221.

The image processing package 100_2 may be replaced by one of the image processing packages 100_1 and 100_3 shown in FIG. 5a and FIG. 5c.

Like this, since the image processing package 100_2 having a small size and a lower power consumption is mounted on the camera module 200, the camera module 200 may have a small size and be manufactured in a subminiature size, and consume a lower power.

Although various embodiments have been described for illustrative purposes, it will be apparent to those skilled in the art that various changes and modifications may be made without departing from the spirit and scope of the Invention as defined in the following claims.

What is claimed is:

1. An image processing package, comprising:
    an image sensor suitable for receiving an image of a subject, which is incident from an outside, in a form of light and converting the image of the subject into an image signal;
    an image signal processor suitable for processing the image signal which is outputted from the image sensor and reproducing the image of the subject;
    a controller suitable for controlling an operation of the image signal processor; and
    a memory device suitable for storing a signal outputted from the controller,
    wherein the image sensor, the image signal processor, the controller and the memory device are sequentially and vertically stacked from the top, and
    wherein the controller performs an input or output operation of data stored in the memory device to an external device, analyzes the data transferred from the external device, and determines whether the data is to be stored in the memory device or the data stored in the memory device is to be transferred to the external device.

2. The image processing package of claim 1, wherein the image sensor and the image signal processor are electrically coupled to each other by one of a through silicon via (TSV) manner and a direct bonding interface (DBI) manner.

3. The image processing package of claim 1, wherein the image signal processor and the controller are electrically coupled to each other by one of a through silicon via (TSV) manner and a direct bonding interface (DBI) manner.

4. The image processing package of claim 1, wherein the controller and the memory device are electrically coupled to each other by one of a through silicon via (TSV) manner and a direct bonding interface (DBI) manner.

5. The image processing package of claim 1, wherein the image sensor and the image signal processor are stacked on a package substrate, which is electrically coupled to an external device.

6. The image processing package of claim 5, wherein the image sensor and the image signal processor are encapsulated by an encapsulant, and an upper portion of the image sensor is opened such that a light is incident from an outside.

7. A camera module, comprising:
a body;
an optical series mounted on an upper portion of the body and having at least one lens;
a color filter suitable disposed on a lower portion of the optical series and filtering and outputting a light, which passes through the optical series; and
an image processing package disposed on a lower portion of the color filter, receiving the light outputted from the color filter and performing an image process,
wherein the image processing package includes:
an image sensor suitable for receiving an image of a subject, which is incident from an outside, in a form of light and converting the image of the subject into an image signal;
an image signal processor suitable for processing the image signal which is outputted from the image sensor and reproducing the image of the subject;
a controller suitable for controlling an operation of the image signal processor;
a memory device suitable for storing a signal outputted from the controller,
wherein the image sensor, the image signal processor, the controller and the memory device are sequentially and vertically stacked from the top, and
wherein the controller performs an input or output operation of data stored in the memory device to an external device, analyzes the data transferred from the external device, and determines whether the data is to be stored in the memory device or the data stored in the memory device is to be transferred to the external device.

8. The camera module of claim 7, wherein the image sensor and the image signal processor are electrically coupled to each other by one of a through silicon via (TSV) manner and a direct bonding interface (DBI) manner.

9. The camera module of claim 7, wherein the image signal processor and the controller are electrically coupled to each other by one of a through silicon via (TSV) manner and a direct bonding interface (DBI) manner.

10. The camera module of claim 7, wherein the controller and the memory device are electrically coupled to each other by one of a through silicon via (TSV) manner and a direct bonding interface (DBI) manner.

11. The camera module of claim 7, wherein the image sensor and the image signal processor are stacked on a package substrate, which is electrically coupled to an external device.

12. The camera module of claim 11, wherein the image sensor and the image signal processor are encapsulated by an encapsulant, and an upper portion of the image sensor is opened such that a light is incident from an outside.

* * * * *